United States Patent
Bauer et al.

(10) Patent No.: US 8,330,260 B2
(45) Date of Patent: Dec. 11, 2012

(54) ELECTRONIC COMPONENT OF VQFN DESIGN AND METHOD FOR PRODUCING THE SAME

(75) Inventors: Michael Bauer, Nittendorf (DE); Ludwig Heitzer, Regensburg (DE); Christian Stuempfl, Schwandorf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/780,827

(22) Filed: Jul. 20, 2007

(65) Prior Publication Data

US 2008/0017986 A1   Jan. 24, 2008

(30) Foreign Application Priority Data

Jul. 20, 2006  (DE) .......................... 10 2006 033 701

(51) Int. Cl.
    *H01L 23/02*        (2006.01)

(52) U.S. Cl. ................. 257/678; 257/E21.499; 438/100; 438/438; 438/458

(58) Field of Classification Search .................. 438/100; 257/678, E21.499
See application file for complete search history.

(56) References Cited

U.S. PATENT DOCUMENTS

| | | | | |
|---|---|---|---|---|
| 5,552,345 A | * | 9/1996 | Schrantz et al. | 438/460 |
| 5,869,905 A | * | 2/1999 | Takebe | 257/787 |
| 6,079,610 A | | 6/2000 | Maeda et al. | |
| 6,282,795 B1 | * | 9/2001 | Poole et al. | 30/172 |
| 6,518,093 B1 | * | 2/2003 | Nakamikawa | 438/108 |
| 2002/0074672 A1 | * | 6/2002 | Huang et al. | 257/788 |
| 2003/0127711 A1 | | 7/2003 | Kawai et al. | |
| 2003/0213580 A1 | * | 11/2003 | Philpott et al. | 165/46 |
| 2004/0222503 A1 | | 11/2004 | Lee et al. | |
| 2005/0012227 A1 | * | 1/2005 | Bolken | 257/787 |
| 2005/0087859 A1 | * | 4/2005 | Chao et al. | 257/700 |
| 2005/0253286 A1 | | 11/2005 | Yoshikawa et al. | |
| 2006/0063351 A1 | * | 3/2006 | Jain | 438/455 |
| 2007/0111397 A1 | * | 5/2007 | Kim et al. | 438/124 |

* cited by examiner

*Primary Examiner* — Thao Le
*Assistant Examiner* — Matthew Gordon
(74) *Attorney, Agent, or Firm* — Edell, Shapiro & Finnan, LLC

(57) ABSTRACT

A method for producing an electronic component of a VQFN (very thin quad flat pack no-lead) design includes the following method steps: anchoring at least one integrated circuit element on a sacrificial substrate; contact-connecting the at least one integrated circuit element to the sacrificial substrate with formation of contact-connecting points on the sacrificial substrate; forming an encapsulation on a top side of the sacrificial substrate, the at least one anchored integrated circuit element being mounted on the top side of the sacrificial substrate; removing the sacrificial substrate, thereby uncovering a portion of the contact-connecting points on the underside of the encapsulation.

23 Claims, 3 Drawing Sheets

ELECTRONIC COMPONENT OF VQFN DESIGN AND METHOD FOR PRODUCING THE SAME

CROSS REFERENCE TO RELATED APPLICATIONS

This application claims priority under 35 U.S.C. §119 to Application No. DE 102006033701.8 filed on Jul. 20, 2006, entitled "Production Method for an Electronic Component and Component of VQFN Design," the entire contents of which are hereby incorporated by reference.

BACKGROUND

Electronic components of QFN (quad flat pack no-lead) or VQFN (very thin quad flat pack no-lead) design are devices with a reduced or absent leadframe. Instead of the pins known from conventional component housings, components of this type have short connecting areas, while the housing of the component comprises an encapsulation provided only above the wiring carrier.

Components of this type are used wherever it is necessary for a printed circuit board or a comparable circuit arrangement to be configured in a manner that saves as much space as possible. Under certain circumstances, they can also serve as a replacement for electronic devices with a so-called BGA configuration. The designation BGA is an abbreviation of "ball grid array" and describes a contact area which is occupied with solder balls and which is formed on the underside of an electronic component configured in this way.

Components of the type mentioned are produced by applying a semiconductor element (e.g., a semiconductor chip) to a metallic carrier. Carriers of this type have to be structured and cause high costs due to their production. During the application, in particular adhesive bonding, of relatively large chips, poorly conducting thermal bridges occasionally form; whereby, components of this type are highly susceptible to overheating. Finally, the electronic component often exhibits a poor MSL (moisture sensitivity level) performance with an MSL value of greater than 2 or 3 due to insufficient adhesion of molding compound and adhesive on the surface of the leadframe.

Consequently, a production method and a component structure are desired for cost-effective production of such VQFN components which leads to components having an improved performance and operational reliability and can be used in particular in mass production.

SUMMARY

A method to produce an electronic component of a VQFN (very thin quad flat pack no-lead) design is described herein. The production method includes the following method steps: anchoring at least one integrated circuit element, in particular of a semiconductor chip, on a sacrificial substrate; contact-connecting the at least one integrated circuit element to the sacrificial substrate with formation of contact-connecting points on the sacrificial substrate; forming an encapsulation on a top side of the sacrificial substrate, the at least one anchored integrated circuit element being mounted on the top side of the sacrificial substrate; removing the sacrificial substrate, thereby uncovering a portion of the contact-connecting points disposed on the underside of the encapsulation.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The production method and the electronic component will be explained in more detail below on the basis of exemplary embodiments and figures. For identical or identically acting parts, the same reference symbols are used in all the figures, where.

DETAILED DESCRIPTION

Figure 1:
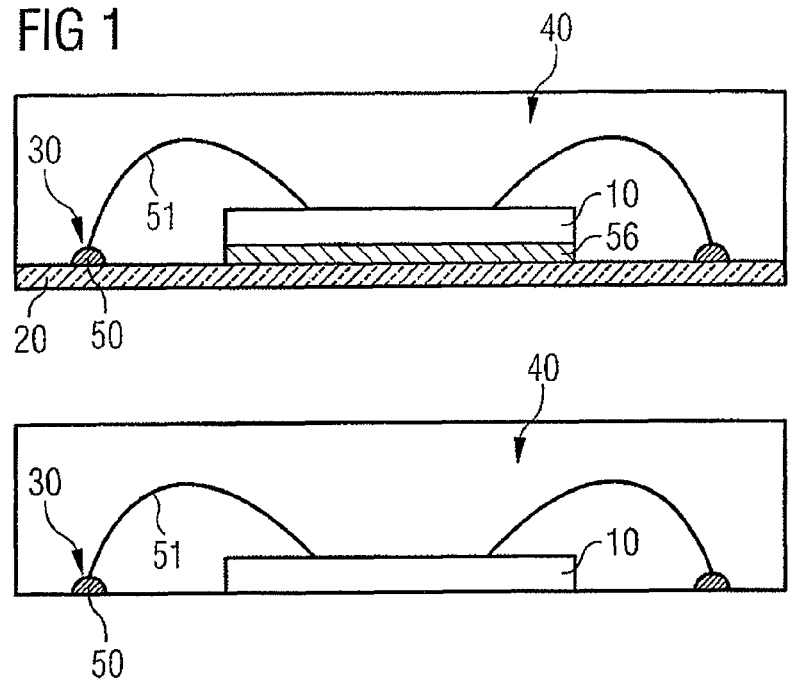
FIG. 1 shows an exemplary layer structure of the electronic component with sacrificial substrate and removed sacrificial substrate in a sectional illustration.

A proposed production method for an electronic component of VQFN design features the following method steps:

The first step involves providing a sacrificial substrate. Afterward, an integrated circuit element (e.g., a semiconductor chip) is anchored on the sacrificial substrate. The integrated circuit element is contact-connected to the sacrificial substrate, contact-connecting points being formed on the sacrificial substrate. The next step involves forming an encapsulation on the top side of the sacrificial substrate, the top side having the integrated circuit element mounted on it. The sacrificial substrate is removed after the formation of the encapsulation, the contact-connecting points being uncovered on the underside of the encapsulation in the process.

The production method according to the invention is therefore based on arranging the integrated circuit elements on a sacrificial substrate, which is used only temporarily as a support or opposite surface for producing contact-connections at the integrated circuit element and is completely removed (sacrificed) after the completion of the contact-connections and the encapsulation. As a result, the underside of the encapsulation with the integrated circuit element now enclosed in the encapsulation and the contact-connecting points embedded in the encapsulation is completely uncovered.

Consequently, the cost-intensive carriers structured in a complicated fashion which are necessary from the known production methods are completely obviated, while in the case of the components produced according to the described method, the abovementioned performance problems no longer occur simply by virtue of the complete absence of a conventional carrier. Moreover, the components produced in this way also have a particularly simple construction.

Soldering or alloying of the integrated circuit element with a preceding metallization of the sacrificial substrate is employed for the mechanical anchoring of the integrated circuit elements on the sacrificial substrate. In this case, the anchoring essentially only fulfills the purpose of positioning the integrated circuit element on the sacrificial substrate precisely and in a manner secured against displacements.

Various materials can be used as the sacrificial substrate. A first embodiment includes a metallized, etchable and grindable silicon wafer. Substrates of this type are cost-effective and are obtained as rejects or by-products in chip making.

Alternatively, the sacrificial substrate comprises a planar, etchable and grindable glass body metallized on the top side. Likewise, the sacrificial substrate can comprise a planar, etchable and grindable metal body metallized on the top side, the metal body comprising, for example, nickel, a nickel alloy, steel, copper or a copper alloy.

Finally, an embodiment of the sacrificial substrate comprising a composite fiber material (e.g., paper) metallized on its surface is also appropriate. Materials of this type are lightweight, cost-effective and can be removed particularly well.

The integrated circuit element may be contact-connected on the sacrificial substrate via wire bonding, for example. For this purpose, in one expedient configuration of bonding, a series of bonding bumps are placed on the sacrificial substrate outside the periphery of the integrated circuit element and the bonding is performed between the bonding bumps and bonding pads on the integrated circuit element.

As an alternative to the formation of the bonding bumps, a reverse bonding can also be performed between integrated circuit element and sacrificial substrate, thereby forming nailheads on the sacrificial substrate. The bonding bumps or nailheads serve for forming the contact-connecting points of the wire bonding connections that arise on the sacrificial substrate with a sufficient size in order that they have a sufficient size and extent later on the uncovered underside of the encapsulation.

In this case, the bonding bumps constitute small elevations or elevated points with a widened base area on the surface of the sacrificial substrate. The nailheads in turn arise automatically during the reverse bonding process, in which a wedge concludes a bonding cycle on the integrated circuit element rather than on the substrate.

The encapsulation is performed, for example, via a large-area molding process in the form of a covering of a plurality of integrated circuit elements anchored and contact-connected on the sacrificial substrate, thereby forming a continuous molding compound layer that covers a plurality of integrated circuit elements. Such an encapsulation step allows for mass production of the integrated circuit element.

The sacrificial substrate can be removed in various ways. In a first embodiment, the removal is effected by grinding away the material of the sacrificial substrate. In a further embodiment, the sacrificial substrate is removed by etching away or stripping. The respectively most expedient process used for removing the sacrificial substrate depends on the chemico-physical properties of the material forming the sacrificial substrate.

The removal of the sacrificial substrate is expediently followed by singulation of the continuous molding compound layer into a quantity of individual components. In a first embodiment, the singulation can be effected via cutting, (e.g., laser cutting). In a second embodiment, the singulation is effected via sawing and/or separation by grinding. The respectively most expedient singulation process depends on the type of encapsulation material or the quality to be achieved for the separating edges of the individual components.

The following description is directed towards a proposed electronic component. The described electronic component includes a substrateless arrangement comprising an integrated circuit element (e.g., semiconductor chip); an encapsulation covering the integrated circuit element at least on a top side thereof; a series of bonding wires leading from the integrated circuit element to contact-connecting points embedded on the underside of the encapsulation.

Accordingly, the component advantageously comprises the integrated circuit element and the encapsulation with the embedded contact-connection without the need of a carrier. Complicated carrier materials and carrier configurations are completely obviated. Due to the lastingly simplified construction, the device can be inserted in particularly flat and space-saving fashion in circuits.

In a first embodiment, the contact-connecting points are formed as bonding wire balls embedded into the encapsulation. In a second embodiment, the contact-connecting points are formed as nailheads embedded into the encapsulation with a bonding wire residue hidden (i.e., embedded) in the encapsulation. Both embodiments have sufficiently large contact-connecting points.

In an exemplary embodiment of the electronic component, the underside of the encapsulation is formed as a ball grid array of the electronic component with solder balls applied on the contact-connecting points. The electronic component can thus be processed like a BGA substrate or a component of BGA design and be contact-connected to a printed circuit board.

In the following paragraphs, exemplary embodiments of the device and method are described in connection with the figures.

FIG. 1 shows, in the upper illustration, an exemplary layer structure of the electronic component before the removal of the sacrificial substrate and, in the lower illustration, an exemplary layer structure of the electronic component after the removal of the sacrificial substrate. An integrated circuit element 10, for example a semiconductor chip, is anchored on the sacrificial substrate 20 and contact-connected to the surface thereof via a series of contact-connecting points 30. That surface of the sacrificial substrate which is occupied by the integrated circuit element and also the contact-connecting points lie under an encapsulation 40.

The sacrificial substrate 20 has been removed in the lower illustration. The contact-connecting points 30 are now uncovered on the underside of the encapsulation 40 and now form the outer contact-connecting locations of the finished electronic component of the VQFN design.

The contact-connecting points 30 are formed for complication-free contact-connection of the electronic component as bonding wire balls or ball bumps 50, from each of which a bonding wire 51 runs to the integrated circuit element 10. In this case, the bonding wire balls form an enlarged base area on the sacrificial substrate 20 and therefore an enlarged contact area on the finally finished component after the removal of the sacrificial substrate.

The bonding wires and ball bumps comprise the material that is customary for semiconductor contact-connections (e.g., aluminum, copper, gold or the corresponding alloys). The integrated circuit element 10 is anchored on the sacrificial substrate via customary methods (e.g., soldering or alloying). The sacrificial substrate or the integrated circuit element includes a metallization 56 for this purpose.

Figure 2:
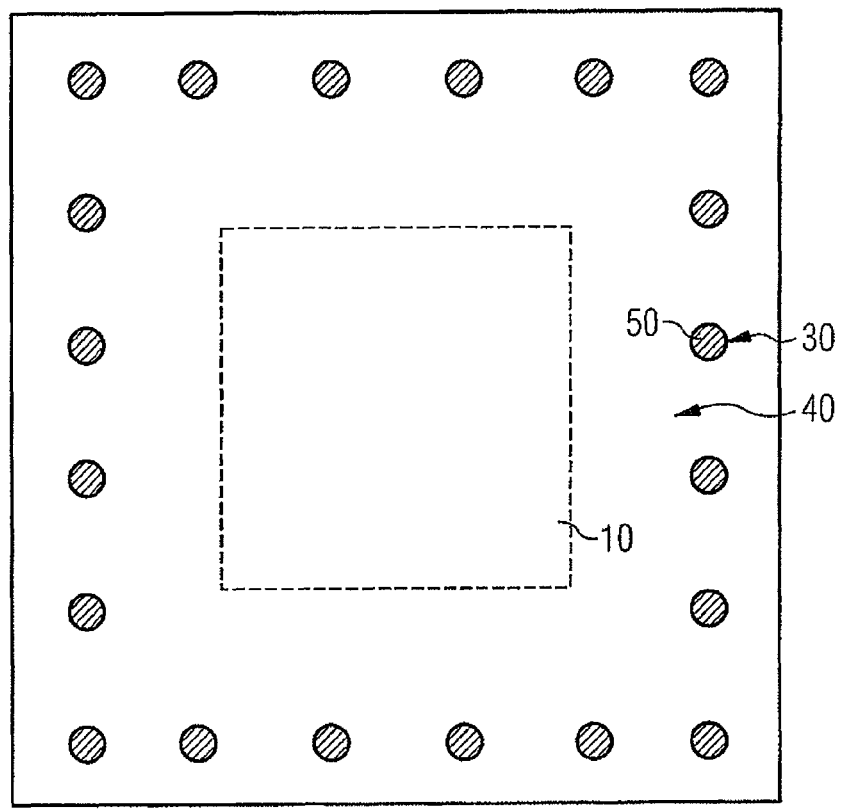
FIG. 2 shows the electronic component shown in FIG. 1 in a view from below.

FIG. 2 shows by way of example a bottom view of the component according to an exemplary embodiment. The illustration reveals the underside of the encapsulation 40 with the integrated circuit element 10 embedded therein and with the contact-connecting points 30, in other words, the now uncovered undersides of the ball bumps 50, being exposed on the area of the encapsulation. As can be seen from the figure, the contact-connecting points have a defined geometrical position with respect to one another and, in this example, are arranged along a line running essentially in square fashion.

In such an embodiment, the underside of the electronic component is formed as a ball grid array (BGA) and can be contact-connected like a BGA substrate on a printed circuit board or some other element carrier.

FIGS. 3 to 8 show exemplary production steps for the component according to an exemplary embodiment which is suitable in particular for mass production.

Figure 3:
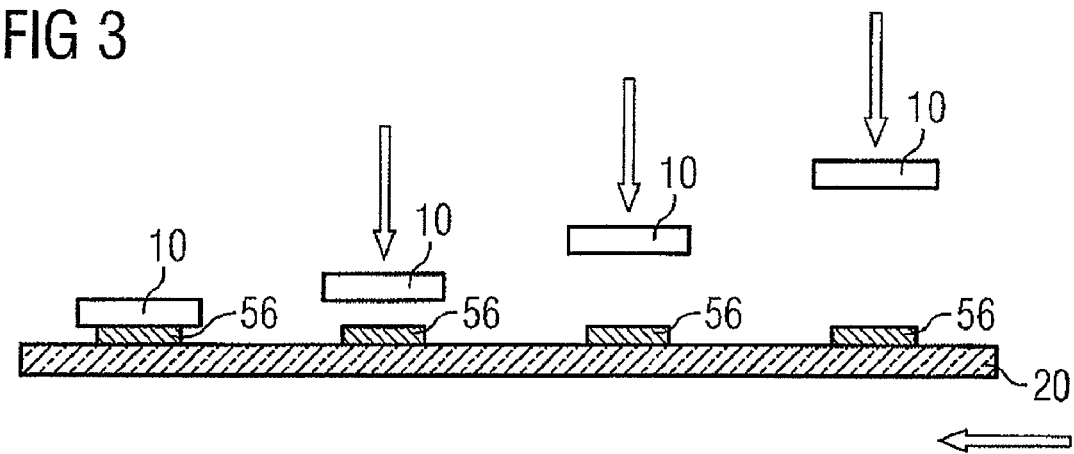
FIG. 3 to FIG. 8 show a series of exemplary steps of the production method to mass produce the electronic component.

FIG. 3 shows an exemplary placement process for the sacrificial substrate 20. The example illustrated here involves a silicon wafer comprising metallized regions 56 at least in the region of the anchoring locations of the semiconductor substrate. The silicon wafer is a so-called "dummy" wafer, for example, which follows along for filling up charging batches in the processing processes for producing semiconductor chips, but on which no semiconductor chips are produced, and which arises as a by-product from the chip making production process.

It is likewise possible to use wafers that have been separated out as rejects from other production processes or are returned to the production process after a certain recycling process. Such sacrificial substrates in the form of silicon wafers are therefore available, in principle, without a relatively high outlay in respect of costs and in respect of production.

The metallization 56 has a thickness in the range of up to 3 μm and is expediently applied via a vapor deposition method using customary coating installations and technologies (e.g., sputtering or vacuum vapor deposition).

In the illustration in FIG. 3, a relatively large sacrificial substrate 20 passes through in a production installation and is occupied with the integrated circuit elements 10 at regular intervals. The occupation can be effected in a one-dimensional direction, i.e., along a strip. Optionally, however, two-dimensional arrangements of integrated circuit elements will be anchored on a single relatively large sacrificial substrate. The occupation and anchoring are effected via, for example, soldering or alloying. Adhesive bonding is likewise possible.

Figure 4:
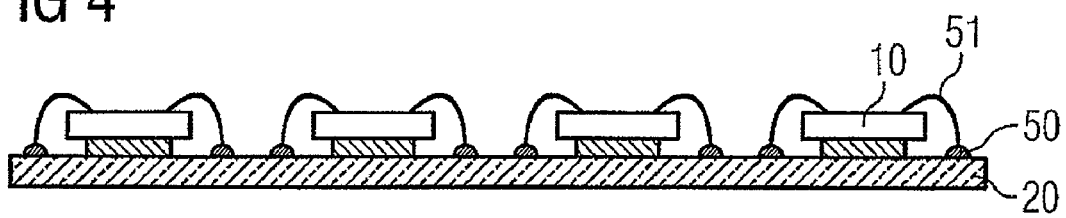
Figure 5:
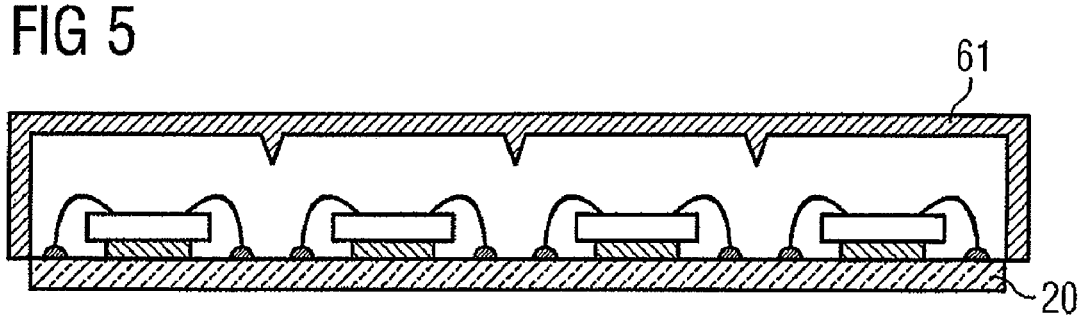
Figure 6:
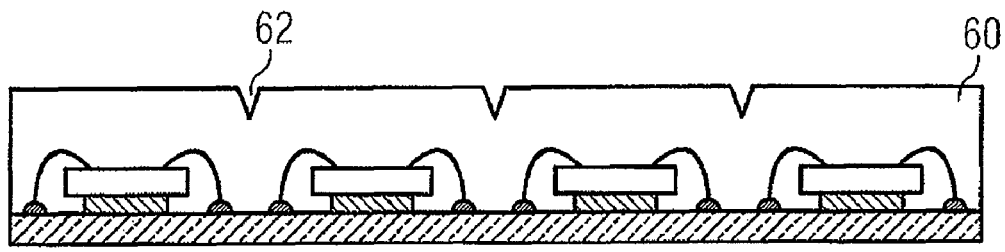

The integrated circuit elements anchored on the sacrificial substrate 20 are then contact-connected on the sacrificial substrate. One example of this is shown in FIG. 4. In this example, first of all, in the vicinity of each anchored integrated circuit element, a series of ball bumps or bonding wire balls 50 are deposited on the sacrificial substrate in the contact geometry required for the later component. For this purpose, it is possible to have recourse to a conventional wedge or ball bonding. In this case, the deposited ball bumps form a series of contact-connecting points with enlarged contact areas on the sacrificial substrate.

This is followed by bonding between the ball bumps and the integrated circuit element via a conventional wedge or ball bonding method.

Instead of placing the ball bumps and subsequent bonding, it is also possible to perform a reverse bonding between the integrated circuit element and the sacrificial substrate. This bonding method involves producing nailheads with bonding wire residues on the sacrificial substrate and simultaneously contact-connecting the integrated circuit element. With reference to the illustration in FIG. 4 it should be noted that it is possible to produce more than two contact-connecting points per integrated circuit element on the sacrificial substrate with more than two bonding wires, in which case the contact-connecting points can be distributed around the integrated circuit elements, for example, in accordance with the illustration in FIG. 2. The concrete arrangement of the integrated circuit elements on the sacrificial substrate and also the most effective spatial layout and conception of the bonding geometry are planned depending on the component to be produced. In this case, particular patterning of the sacrificial substrate is not necessary. The integrated circuit elements can be positioned in a very high density on the sacrificial substrate. The pitch spacings can be realized very finely and are freely programmable.

The contact-connection is followed by an encapsulation step. A first partial step is illustrated for example in FIG. 5. Encapsulation via a so-called molding process, i.e., with application of a molding compound, is described below.

The arrangement of the integrated circuit elements contact-connected on the sacrificial substrate is covered with a mold 61. In one exemplary configuration, the mold has an internal shaping that facilitates later singulation of the electronic components. It is subsequently filled with molding compound.

After the molding compound has been filled in and the mold has been removed, the arrangement of the contact-connected integrated circuit elements on the sacrificial substrate is covered with molding compound in planar fashion. The molding compound forms a planar molding compound layer 60, which, if appropriate, comprises a series of desired breaking points 62 for later singulation.

The sacrificial substrate 20 is subsequently removed. Etching or grinding methods, for example, can be employed for this purpose. The precise planning and technological configuration of removal depends on the material and the thickness of the sacrificial substrate. Sacrificial substrates comprising composite fiber materials (e.g., paper or related materials) can be removed, for example, via a combined etching and soaking off process. For example, the action of superheated steam with addition of cellulose-decomposing chemicals is possible for this purpose.

Sacrificial substrates comprising glass materials can be etched away, for example, via the action of hydrofluoric acid or similar compounds. Owing to the properties harmful to the environment or the hazardousness of such chemicals, the sacrificial substrate can also be ground away. The grinding away is achieved, for example, either via a grinding surface rotating on the sacrificial substrate or via a powder jet process. The latter affords the advantage of a high removal rate and a low-wear and precise grinding technology. Sacrificial substrates comprising silicon or metals can likewise be ground away or etched away, for example, via the corresponding chemicals or grinding techniques.

Figure 7:
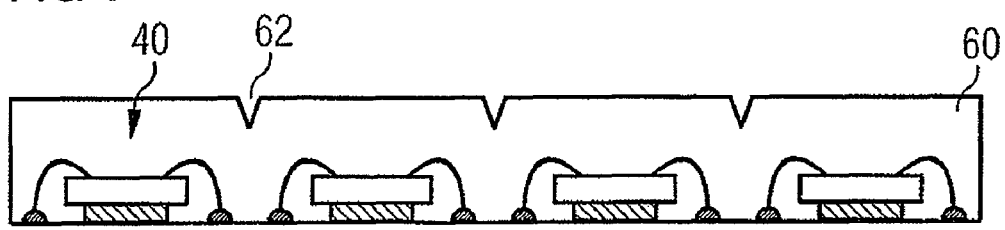

The molding compound layer 60 illustrated in FIG. 7 with the integrated circuit elements embedded within the molding compound layer 60 and the ball bumps 50 uncovered on the underside are present as a result. The housing comprises a series of desired breaking points 62 at which the components are subsequently singulated.

For this purpose, the molding compound layer is expediently transferred to a dicing tape and separated along the desired breaking points. The separation process can be effected, inter alia, via sawing, laser cutting or separation by grinding. The separation process is simplified via the wedge effect of the desired breaking points. Alternatively, breaking along the desired breaking points with the action of a wedge or a stamping tool placed onto the desired breaking points is also possible.

Figure 8:
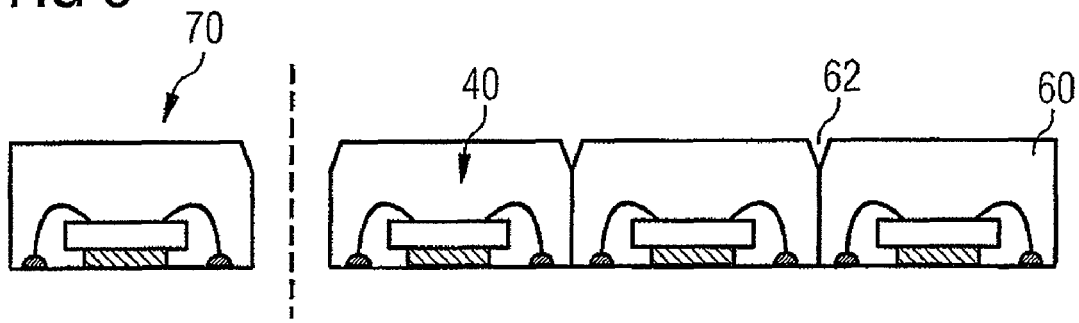

FIG. 8 schematically shows the separation process. The housing 60 placed onto the dicing tape is separated along the desired breaking points 62. The singulated component 70 adheres on the dicing tape and thus does not fall away in an uncontrolled manner. After the separation of the individual electronic components, the dicing tape with the components now individually present is moved to a removal station, from which the components now individually present can be removed and processed further.

The production method described is highly productive by virtue of the large quantity of devices which are arranged on a sacrificial substrate and produced virtually simultaneously. Solderable surfaces, i.e., the contact-connections 30, are present directly on the underside of the electronic VQFN packages and additional metal coating (i.e., plating) can therefore be omitted in subsequent processing steps. The housings themselves can be realized in extremely thin fashion, for example, with a thickness of less than 500 µm.

The resulting components have low moisture sensitivity (e.g., MSL of 1 or 2).

While the production method and the electronic component have been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A method for producing an electronic component, the method comprising:
    applying a plurality of spaced metallization layers at predetermined anchoring locations along a surface of a sacrificial substrate such that the sacrificial substrate surface defines metalized areas and non-metalized areas, wherein the surface including the metallization layers defines a top side of the sacrificial substrate, and wherein the sacrificial substrate comprises paper;
    anchoring an integrated circuit element to each of said metallization layers disposed on the top side of the sacrificial substrate, each integrated circuit element including a bonding pad;
    forming contact-connecting points on the top side of the sacrificial substrate by placing an arrangement of bonding bumps on the sacrificial substrate such that a portion of each bonding bump is in direct contact with the sacrificial substrate;
    performing wire bonding between the bonding bumps on the sacrificial substrate and the bonding pad of the integrated circuit element to electrically connect the integrated circuit element to the sacrificial substrate;
    covering the top side of the sacrificial substrate with a mold including internal shaping configured to define a breaking point between adjacent integrated circuit elements, the breaking point configured to facilitate singulation;
    filling the mold with molding compound to encapsulate the integrated circuit element anchored and contact-connected to the sacrificial substrate, as well as to encapsulate the bonding bump portion not in direct contact with the sacrificial substrate, wherein the mold forms a continuous molding compound layer including a plurality of defined breaking points;
    removing the sacrificial substrate to uncover one or more of the contact-connecting points disposed within the encapsulation by exposing the portion of the bonding bump in direct contact with the substrate; and
    singulating, after the removal of the sacrificial substrate, the continuous molding compound layer into individual components by cutting along one or more of the breaking points to produce at least one electronic component.

2. The method according to claim 1, wherein the wire bonding comprises:
    performing the bonding via a reverse bonding with formation of nailheads on the sacrificial substrate.

3. The method according to claim 1, wherein the continuous molding compound layer is singulated via laser cutting along said breaking points.

4. The method according to claim 1, wherein the continuous molding compound layer is singulated via sawing or grinding.

5. A method for producing an electronic component, the method comprising:
    applying a plurality of laterally spaced metallization layers via vapor deposition to selected areas of a top side of a sacrificial substrate such that the substrate top side defines metalized areas and non-metalized areas;
    anchoring an integrated circuit element to each of said metallization layers disposed on the sacrificial substrate, each integrated circuit element including a bonding pad;
    forming contact-connecting points on the sacrificial substrate by placing an arrangement of bonding bumps directly onto the non-metalized areas of the sacrificial substrate such that a portion of the bonding bumps is in direct contact with the sacrificial substrate;
    wire bonding the sacrificial substrate to the bonding pads of the integrated circuit element via the bonding bumps, thereby contact-connecting the at least one integrated circuit element to the sacrificial substrate;
    applying encapsulation material to the top side of the sacrificial substrate to encapsulate the integrated circuit element anchored to the top side of the sacrificial substrate and to encapsulate the bonding bump portion not in contact with the sacrificial substrate; and
    after encapsulation, removing the sacrificial substrate via a soaking off process effective to uncover the bonding bump portion in contact with the sacrificial substrate and thereby expose the contact-connecting points disposed along an underside of the encapsulation.

6. A method for producing an electronic component, the method comprising:
    anchoring a plurality of integrated circuit elements on a sacrificial substrate via metallization of a surface of the sacrificial substrate and soldering or alloying each integrated circuit element on the metalized sacrificial substrate, wherein the sacrificial substrate comprises paper;
    forming contact-connecting points on the sacrificial substrate by placing an arrangement of bonding bumps directly onto the sacrificial substrate, thereby contact-connecting the at least one integrated circuit element to the sacrificial substrate;
    covering the integrated circuit elements anchored and contact-connected along a top side of the sacrificial substrate with a continuous molding compound;
    removing the sacrificial substrate via a soaking off process effective to decompose the sacrificial substrate and to uncover at least a portion of the contact-connecting points disposed along an underside of the encapsulation; and
    singulating, after the removal of the sacrificial substrate, the continuous molding compound layer into individual components to produce at least one electronic component.

7. The method according to claim 6, wherein the continuous molding compound layer is singulated via laser cutting.

8. The method according to claim 1, wherein a portion of the bonding bumps for wire bonding not in direct contact with the sacrificial substrate comprises a rounded surface.

9. The method according to claim 1, wherein the molding compound layer forms a coplanar surface with the sacrificial substrate in areas between the bonding bumps and the at least one integrated circuit element.

10. The method according to claim 1, wherein each metallization layer is applied via vapor deposition such that each of said metallization layers possesses a thickness of up to 3 µm.

11. The method according to claim 1, wherein:

the plurality of metallization layers comprises a first metallization layer laterally spaced relation from a second metallization layer to define a space between the first and second metallization layers, wherein the space defines the non-metalized area of the substrate; and a plurality of bonding bumps is applied directly to the sacrificial substrate within the space defined between the first and second metallization layers.

12. The method according to claim 5, wherein the soaking off process comprises applying cellulose decomposing agents to the sacrificial substrate and exposing the sacrificial substrate to steam.

13. The method according to claim 6, wherein the soaking off process comprises applying cellulose decomposing agents to the sacrificial substrate.

14. The method according to claim 13, wherein the soaking off process further comprises exposing the sacrificial substrate to steam.

15. The method according to claim 5, wherein the soaking off process comprises exposing the sacrificial substrate to superheated steam.

16. The method according to claim 1, wherein:

the sacrificial substrate is formed of cellulose; and the substrate is dissolved by applying a cellulose decomposing agent to the substrate, the cellulose decomposing agent being effective to dissolve the cellulose.

17. The method according to claim 1, wherein the removal process comprises exposing the sacrificial substrate to steam.

18. The method according to claim 1, wherein the removal process comprises a chemical stripping process.

19. The method of claim 1, wherein the removal process comprises a combined etching and soaking off process.

20. The method according to claim 1, wherein the removal process comprises a soaking off process.

21. The method according to claim 20, wherein the soaking off process comprises:

applying cellulose decomposing chemicals to the sacrificial substrate; and exposing the sacrificial substrate to steam.

22. The method according to claim 5, wherein the sacrificial substrate comprises composite fiber materials.

23. The method according to claim 5, wherein the soaking off process comprises applying cellulose decomposing chemicals to the sacrificial substrate.

\* \* \* \* \*